United States Patent [19]

Furukawa et al.

[11] 4,233,669

[45] Nov. 11, 1980

[54] REDUNDANT BUBBLE MEMORY CONTROL SYSTEM

[75] Inventors: Kazuo Furukawa, Yokohama; Sumio Furukawa, Tokorozawa, both of Japan

[73] Assignees: Nippon Telegraph and Telephone Public Corporation; Hitachi, Ltd., both of Japan

[21] Appl. No.: 897,692

[22] Filed: Apr. 19, 1978

[30] Foreign Application Priority Data

Apr. 20, 1977 [JP] Japan .................................. 52-44446
Nov. 30, 1977 [JP] Japan ................................ 52-142759
Nov. 30, 1977 [JP] Japan ................................ 52-142760

[51] Int. Cl.³ .............................................. G11C 19/08
[52] U.S. Cl. ........................................... 365/15; 365/1
[58] Field of Search ...................................... 365/1, 15

[56] References Cited

U.S. PATENT DOCUMENTS 4,073,012  2/1978  Ohnigian ................................ 365/15

OTHER PUBLICATIONS

IBM Technical Disclosure Bulletin–vol. 19, No. 12, May 1977, pp. 4758-4761.

IEEE Transactions on Magnetics–vol. mag-10, Sep. 1974, pp. 852-855.

Primary Examiner—James W. Moffitt
Attorney, Agent, or Firm—Craig & Antonelli

[57] ABSTRACT

A memory control system comprises a memory unit including a plurality of chips each having a shift register type memory having a plurality of information loops, the number of chips being larger than a predetermined number, the predetermined number of bits out of those bits which are read from or written into the information loops of the respective chips at the same timing constituting a unit information; and an additional memory which stores information indicative of normal loop condition or defective loop condition for each of the information loops in each of the chips and information indicative of whether the number of normal loops in each information loop group corresponding to the bits which are read or written at the same timing is larger than said predetermined number or not. Based on the information stored in said additional memory, only the predetermined number of normal loops are selected from the information loops corresponding to the bits which are read or written at the same timing, and when the number of normal loops does not reach the predetermined number, the information loops at that timing are not used.

14 Claims, 10 Drawing Figures

| CHIP \ MINOR LOOP | #0 | #1 | #2 | #3 | #4 | #5 | | #127 | #128 | #129 | #130 | #131 |
|---|---|---|---|---|---|---|---|---|---|---|---|---|
| No. 0 | O | O | O | O | O | O | | O | O | O | O | O |
| No. 1 | O | O | O | O | O | O | | O | O | X | O | O |
| No. 2 | O | X | O | O | O | O | | O | O | O | O | O |
| No. 3 | O | O | O | O | X | O | | O | O | O | O | O |
| No. 4 | O | O | O | O | X | O | | O | O | O | O | O |
| No. 5 | O | O | O | X | O | O | | O | O | O | O | O |
| No. 6 | O | O | O | X | O | O | | O | O | O | X | O |
| No. 7 | O | O | O | X | O | O | | O | O | O | O | O |
| No. 8 | O | O | O | O | O | O | | O | O | O | O | O |
| No. 9 | O | O | O | O | O | O | | O | O | O | O | O |
| BYTE No. | B-0 | B-1 | B-2 | B-3 | B-4 | | | B-126 | B-127 | | | |

FIG. 3
PRIOR ART

| CHIP \ MINOR LOOP | #0 | #1 | #2 | #3 | #4 | #5 | | #127 | #128 | #129 | #130 | #131 |
|---|---|---|---|---|---|---|---|---|---|---|---|---|
| No. 0 | O | O | O | O | O | O | | O | O | O | O | O |
| No. 1 | O | O | O | O | O | O | | O | O | O | O | O |
| No. 2 | O | × | O | O | O | O | | O | O | O | O | O |
| No. 3 | O | O | O | O | O | O | | O | O | O | O | O |
| No. 4 | O | O | O | O | × | O | | O | O | O | O | O |
| No. 5 | O | O | O | O | × | O | | O | O | O | O | O |
| No. 6 | O | O | O | O | O | O | | O | O | O | O | O |
| No. 7 | O | O | O | O | O | O | | O | O | O | O | O |
| BYTE No. | B-0 | | B-1 | B-2 | | B-3 | | B-125 | B-126 | B-127 | | |

FIG. 6

| ROM BIT \ ROM ADR | 0 | 1 | 2 | 3 | 4 | 5 | | 127 | 128 | 129 | 130 | 131 |
|---|---|---|---|---|---|---|---|---|---|---|---|---|
| $2^0$ | 1 | 0 | 1 | 0 | 1 | 1 | | 1 | 1 | / | / | / |
| $2^1$ | 1 | 1 | 1 | 1 | 1 | 1 | | 1 | 1 | / | / | / |
| $2^2$ | 1 | 0 | 1 | 1 | 0 | 1 | | 1 | 1 | / | / | / |
| $2^3$ | 1 | 0 | 1 | 1 | 0 | 1 | | 1 | 1 | / | / | / |
| $2^4$ | 1 | 1 | 1 | 0 | 0 | 1 | | 1 | 1 | / | / | / |
| $2^5$ | 1 | 1 | 1 | 1 | 0 | 1 | | 1 | 1 | / | / | / |
| $2^6$ | 1 | 1 | 1 | 1 | 1 | 1 | | 1 | 1 | / | / | / |
| $2^7$ | 1 | 1 | 1 | 1 | 0 | 1 | | 1 | 1 | / | / | / |

FIG. 4

| MINOR LOOP<br>CHIP | #0 | #1 | #2 | #3 | #4 | #5 | | #127 | #128 | #129 | #130 | #131 |
|---|---|---|---|---|---|---|---|---|---|---|---|---|
| No. 0 | O | O | O | O | O | O | | O | O | O | O | O |
| No. 1 | O | O | O | O | O | O | | O | O | × | O | O |
| No. 2 | O | × | O | O | O | O | | O | O | O | O | O |
| No. 3 | O | O | O | O | × | O | | O | O | O | O | O |
| No. 4 | O | O | O | O | × | O | | O | O | O | O | O |
| No. 5 | O | O | O | × | O | O | | O | O | O | O | O |
| No. 6 | O | O | O | × | O | O | | O | O | O | × | O |
| No. 7 | O | O | O | × | O | O | | O | O | O | O | O |
| No. 8 | O | O | O | O | O | O | | O | O | O | O | O |
| No. 9 | O | O | O | O | O | O | | O | O | O | O | O |

BYTE No.   B-0 B-1 B-2   B-3 B-4     B-126 B-127

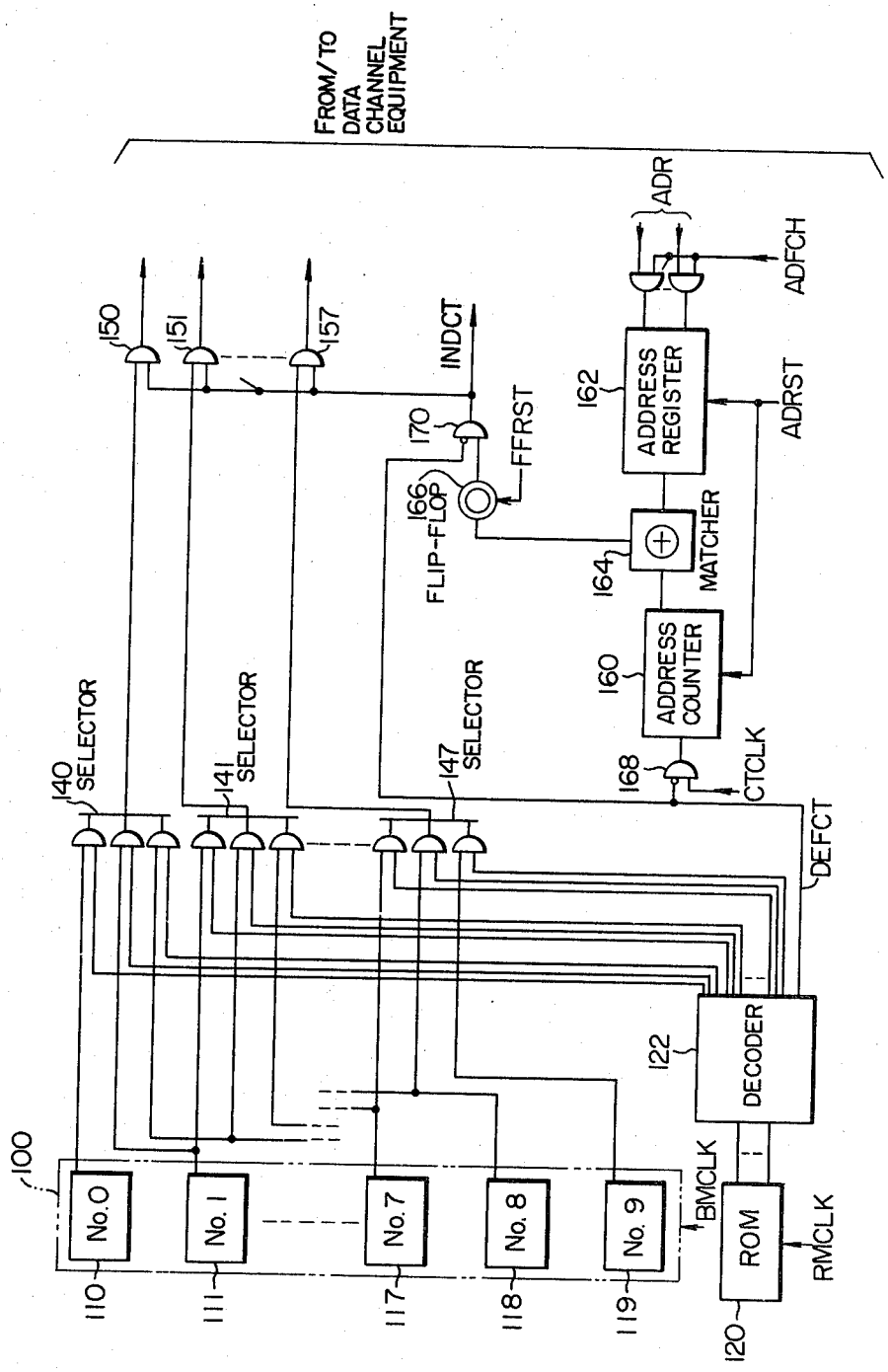

REDUNDANT BUBBLE MEMORY CONTROL SYSTEM

LIST OF PRIOR ART REFERENCES (37 CFR 1.56 (a))

The following references are cited to show the state of the art:

(1) West Germany DOS 2630950 Laid-Open on Feb. 17, 1977 which corresponds to U.S. Pat. No. 4,070,651

(2) U.S. Pat. No. 3,909,810, Naden et al. issued on Sept. 30, 1975.

The present invention relates to a memory control system for a shift register type memory such as a magnetic bubble memory or a change coupled memory (CCD), and more particularly to a control system for enabling selective use of only normal loop of the shift register type memory.

Heretofore, a mechanically rotated memory unit such as a magnetic drum memory or a magnetic disk memory has been used as a file memory for an information processing system. With the recent development of semiconductor technology, a solid-state file memory cell such as a magnetic bubble memory cell or a charge coupled cell has been developed and has been put into practice in certain applications. Since the solid-state file memory cell includes no mechanical rotation, it has more advantages than the prior art file memory, but it is not always advantageous at present stage with respect to the economy.

In order to enhance the economy, the present-day memory uses partial defect devices with a circuit for compensating such partial defect so that a yield of the device is increased to reduce a total cost of the entire system. A magnetic bubble memory is discussed below to explain a prior art selection and control system for defective loops as well as problems encountered therein.

FIG. 1 shows a memory unit comprising eight magnetic bubble chips No. 0 to No. 7. Each of the chips No. 0 to No. 7 comprises 132 minor loops 1 (#0 to #131) for storing and transferring information, a major loop 2 for transferring bubbles for reading or writing information, a detector 3 for reading information and a generator 4 for writing information. When a rotating magnetic field is applied to the chips No. 0 to No. 7, the information in the minor loops 1 and the major loop 2 is synchronously rotated counterclockwise as shown by an arrow in FIG. 1. For example, when information at a point A0 on the minor loop 1, #0 in the chip No. 0 is to be read, the information at the point A0 is moved along the minor loop 1 and transferred to the major loop 2, thence it is moved along the major loop 2 and read by the detector 3. The transfer of the information from the minor loops 1 to the major loop 2 occurs for each of a plurality of information A0 to A131 at the same position in each of the minor loops #0 to #131, and each of the information A0 to A131 is sequentially read by the detector 3 in the order of the positions of the minor loops, that is, in the sequence of A0, A1, . . . , A131. Synchronous rotation also occurs among the plurality of chips No. 0 to No. 7 so that information at the same position in each of the chips, e.g. information A0, B0, . . . , H0 are read at the same timing. The write operation is basically same except that the data flow is opposite to that in the read operation and the write timing is somewhat different from the read timing. Therefore, only the read operation is described hereinafter.

As described above, the present-day magnetic bubble chips are, in many cases, used while they include partial defects. When a defect is included in the major loop, that chip cannot be used, but when a defect is included in a minor loop, that minor loop is defective but other minor loops and the major loop can be used. To this end, spare minor loops are fabricated in the manufacture of the chip. In the illustrated example, 132 minor loops are included in one chip, of which 128 minor loops are actually used while four minor loops are spare loops.

FIG. 2 illustrates a prior art method for selecting defective loops and indicates the normal or defective states of the minor loops #0 to #131 in the magnetic bubble chips No. 0 to No. 7 shown in FIG. 1. Symbol O denotes a normal loop while symbol X denotes a defective loop. In FIG. 2, since the minor loops #0 in the chips No. 0 to No. 7 are all normal loops, the information read at the same timing, e.g. A0, B0, . . . H0 in FIG. 1 are all valid and they are designated as a zero-th byte. As for the minor loops #1, since the chip No. 2 is defective, the information at the next timing, that is, the information of the minor loop #2 is assigned to the chip No. 2. Thus, as shown by encircling with a broken line in FIG. 2, the information of the minor loops #1 in the chips No. 0, No. 1 and No. 3 to No. 7 and the minor loop #2 in the chip No. 2 constitute a first byte.

In this manner, in the past, if the chip includes a defective loop, unit information (8 bits=1 byte in the illustrated example) is constituted by assigning information to a normal minor loop at the next timing in the same chip. In the prior art system, if a defective loop is included, the bits of the unit information (8 bits=1 byte in the illustrated example) are read from the magnetic bubble chips at different timings. Therefore, shift registers which correspond in number to the number of chips and each of which has bit positions corresponding in number to the number of spare minor loops must be provided. As a result, the amount of hardware increases considerably. Furthermore, in this system, that chip which has more number of defective loops than the number of spare loops cannot be used. This results in the decrease of yield.

Another prior art memory control system in which differences in the readout timings of the bits constituting the unit formation from the magnetic bubble chips is eliminated to allow economical use of the shift register is explained below.

FIG. 3 shows normal and defective conditions of the minor loops #0 to #131 in each of the magnetic bubble chips No. 0 to No. 7 shown in FIG. 1, like FIG. 2 shown before, in which symbol O indicates a normal loop and symbol X indicates a defective loop. In FIG. 3, since the minor loops #0 of the chips. No. 0 to No. 7 are all normal loops, the information read out at the same timing are all valid and they are designated as a zero-th byte (byte No. 0 (B-0)). As to the minor loops #1, since the chip No. 2 includes a defective loop, all of the minor loops #1 are not used but skipped for reading. Since the minor loops #2 read out at the next timing are all normal, they are designated as a first byte.

In this system, if a defective loop is included, all of the minor loops which are read at the same timing as that for the defective loop are skipped for reading and the information which are constituted by normal loops only and which are read out at the same readout timing are defined as unit information (8 bits=1 byte in the illustrated example).

In this system, when a defective loop is included, the readout timings for the bits constituting the unit information (8 bits=1 byte) are identical but the readout timing for the bytes is discontinuous. Therefore, shift registers which correspond in number to the number of memory units and each of which has the number of bytes corresponding to the number of spare minor loops must be provided. This results in considerable increase in the amount of hardware. Furthermore, in this system, if one of the minor loops which are read out at the same timing is defective, all of the other loops cannot be used. In addition, if the number of defective loops which are read out at different readout timings exceeds the number of spare loops, the entire memory unit cannot be used. This results in the decrease in the yield.

The prior art systems described above are disclosed, for example, in U.S. Ser. No. 594,901 filed on July 10, 1975, now U.S. Pat. No. 4,070,651 and U.S. Pat. No. 3,909,810 to Naden et al. issued on Sept. 30, 1975.

It is an object of the present invention to provide an improved memory control system which allows the utilization of a shift register type memory chip having a plurality of information loops one or more of which is defective loop.

It is another object of the present invention to provide a memory control system which is simple in construction and economic and in which difference in timings of readout or write of information from or to a plurality of information loops constituting a unit formation is eliminated.

It is another object of the present invention to provide an improved memory system in which a unit information can be constituted by information which is read out from or written into a plurality of information loops including one or more defective loop at the same timing.

It is another object of the present invention to provide an improved memory control system which allows the use of common data transfer unit and control unit to a plurality of memory units including defective loops.

According to the present invention, shift register type memory chips each including a plurality information loops are provided, the number of chips being larger than the number of bits of unit information constituting a byte, by at least one. An additional memory such as a read-out memory for storing information on whether the respective information loops in each of the chips are normal loops or defective loops is provided. A selector is provided which responds to the information stored in the additional memory to eliminate the bits in the defective loops, the number of which is less than the number of additional chips, from the plurality of bits which are read from or written in the corresponding information loops of the plurality of chips at the same timing, to constitute the unit information bits by the remaining normal loop bits. When the number of normal loop bits of the plurality of bits which are read or written at the same timing does not reach the required number of unit information bits, it is determined as a defective byte by the information in the additional memory and the information read out at that timing is not used, or for the information to be written, the write operation is temporarily withheld.

The present invention will be further described with reference to accompanying drawings in which:

FIG. 3 shows a conceptual view illustrating another prior art method of selecting defective loops;

FIG. 4 shows a conceptual view illustrating a method of selecting defective loops in accordance with the present invention;

FIG. 5 shows a partial block diagram of one embodiment of a memory control system of the present invention which is used in the selection method of FIG. 4;

FIG. 6 shows a schematic view illustrating a content of a ROM shown in FIG. 5;

Figures 1, 2:
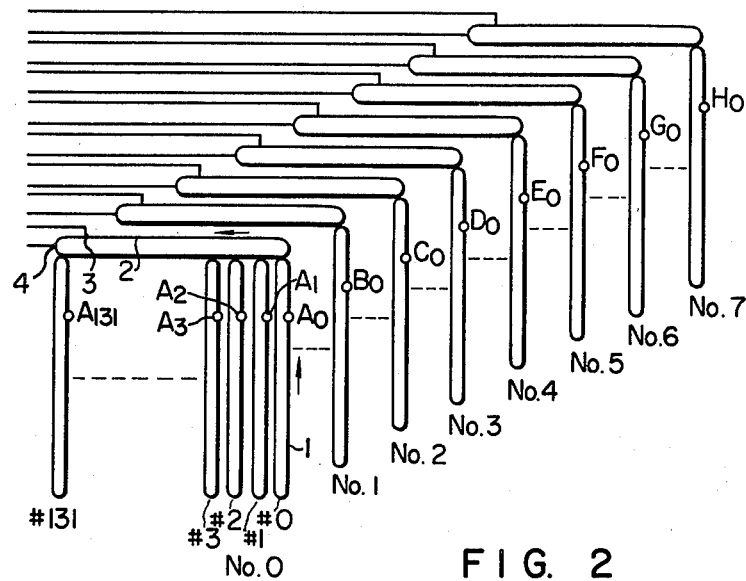
FIG. 1 shows a schematic view illustrating a configuration of a memory unit of a magnetic bubble memory system.
FIG. 2 shows a conceptual view illustrating a prior art method of selecting defective loops.

FIG. 4 shows a manner of use of magnetic bubble chips in accordance with the present invention as well as normal and defective conditions of minor loops in each of chips. As in the previous examples, a unit information is constituted by 8 bits (=1 byte) in the illustrated embodiment. In the previous examples, the number of magnetic bubble chips was equal to the number of unit information bits, i.e. eight, while in the embodiment of the present invention it is ten with two chips being added. Thus, information is read from or written into ten chips at the same timing. Of the ten bits corresponding to those ten chips, eight bits from normal loops are used. If the number of normal loops does not reach eight, all of the ten bits are not used. This will be explained in further detail with reference to FIG. 4.

In FIG. 4, the minor loops #0 of the ten chips No. 0 to No. 9 are all normal loops. In this case, the minor loops #0 of the magnetic bubble chips No. 0 to No. 7 constitute a zero-th byte. As for the minor loops #1, the magnetic bubble chip No. 2 includes a defective minor loop. Therefore, the minor loops of the chips No. 0, No. 1 and No. 3 to No. 8 constitute a first byte. As for the minor loops #2, the minor loops of the chips No. 0 to No. 7 constitute a second byte, like in the case of the minor loops #0. As for the minor loops #3, three minor loops of the chips No. 5 to No. 7 are defective and there are only seven normal loops. Therefore, all of the minor loops at this timing are not used. The eight bits of the chips No. 0 to No. 2 and No. 5 to No. 9 for the minor loops #4 constitute a third byte.

One example of a specific hardware configuration and a control method therefore is shown in FIGS. 5 and 6. In FIG. 5, numeral 100 denotes a magnetic bubble memory unit which includes ten (No. 0 to No. 9) magnetic bubble chips 110 to 119. Numeral 120 denotes a read-only memory (ROM) which stores information of normal loops or defective loops for each group of minor loops, which are read or written at the same timing and information of defective loop group. The ROM 120 stores data shown in FIG. 6 corresponding to FIG. 4. In FIG. 6, ROM addresses (ROM ADR) 0 to 128 correspond to the minor loops #0 to #128 in FIG. 4, but ROM bits $2^0$ to $2^7$ do not correspond to the chips No. 0 to No. 9 of FIG. 4, unlike in the prior art systems, but they are used in th following manner. If no defective loop is included in the ten minor loops which are read or written at the same timing, the ROM bits $2^7$ to $2^0$ are all set to "1". If one defective loop is included, the corresponding defective chip number is indicated by the bits $2^3$ to $2^0$ and the bits $2^7$ to $2^4$ are all set to "1". When two defective loops are included, the corresponding chip numbers are indicated by binary coded numbers by the bits $2^7$ to $2^4$ and $2^3$ to $2^0$, respectively. If three or more defective loops are included, the bits $2^7$ to $2^0$ are set to "11101110" to indicate the defective byte. Numeral 122 denotes a decoder which responds to the information stored in the ROM 120 to produce selection signals for selectors 140 to 147 and a defective byte indication signal DEFCT which identifies a defective loop group. The selectors 140 to 147 receive output information lines from the chips 110 to 117 (No. 0 to No. 7) and output information lines from the chips 111 to 118 (No. 1 to No. 8) and the chips 112 to 119 (No. 2 to No. 9), which output lines are selected by the decoder 122.

The defective byte indication signal DEFCT produced by the decoder 122 is applied to one input of an AND circuit 168 which controls the increment of an address counter 160, the output input of the AND circuit 168 receiving a clock signal CTCLK for incrementing the counter 160. The signal DEFCT is also applied to one input of an AND circuit 170 which controls the transfer of data from AND circuits 150 to 157 to an external unit. The other input of the AND circuit 170 receives an output of a flip-flop 166 which is set when an identity of the content of the address counter 160 and the content of an address register 162 is detected by a matcher 164.

An address information ADR to start the data transfer from the external unit (usually a data channel) has been previously stored in the address register 162 by an address fetch signal ADFCH which commands the taking-in of the information. Upon subsequent request for data transfer, a clock signal BMCLK is applied to the memory unit 100 so that a rotating magnetic field is applied to the chips 110 to 119 (No. 0 to No. 9). As a result, the information stored in the chips are moved along the minor loops, transferred out to the major loops and read out by detectors. Assume that the ten bits of the minor loops #0 are first read from the chips 110 to 119. In this case, the ROM 120 is activated by a clock signal RMCLK so that the information at the ROM ADR 0 is read out. The information read at this time is all "1" indicating that all loops are normal. Thus, the top one of the three select gates of each of the selectors 140 to 147 are opened by the decoder 122 and the information from the chips 110 to 117 (No. 0 to No. 7) constitute the zero-th byte. Since all of the minor loops #0 are normal loops, the defective byte indication signal DEFCT is "0" at this time so that the AND circuit 168 is opened to increment the address counter 160. When the identity of the content of the address counter 160 and the content of the address counter 162 is detected by the matcher 164, the flip-flop 166 is set. As a result, the AND circuit 170 is opened because the signal DEFCT is "0" so that the zero-th byte information is transferred to the external unit through the AND circuits 150 to 157.

The minor loops #1 are then read from the chips 110 to 117 (No. 0 to No. 9). At the same time, the information at the ROM ADR 1 is read from the ROM 120. The ROM bits $2^3$ to $2^0$ at the ROM ADR 1 are "0010" indicating that the chip No. 2 is defective and the ROM bits $2^7$ to $2^4$ are all "1" indicating that there is no further defective chip. The decoder 122 causes the top one of the three gates for each of the selectors 140 and 141 to which the chips upstream of the defective chip are connected to open, that is, the output information lines of the chips No. 0 and No. 1 to be selected, and the middle one of the three gates for each of the selectors 142 to 147 to which the defective chip and the chips downstream the defective chip are connected through the top gates to open, that is, the output information lines of the chips No. 3 to No. 8 to be selected. As a result, the information of the magnetic bubble chips 110, 111 and 113 to 118 (No. 0, No. 1 and No. 3 to No. 8) constitute the first byte. The defective byte indication signal DEFCT is also "0" at this time and the address counter 160 is incremented. If the AND circuits 150 to 157 are opened at this time, the first byte information is transferred to the external unit.

As for the minor loops #2, since all of the loops are normal like in the case of the minor loops #0 and the information of the chips 110 to 117 (No. 0 to No. 7) constitute the second byte. For the minor loops #3, the information "11101110" indicating that the bits $2^7$ to $2^0$ are defective byte is read from the address ROM ADR 3 of the ROM 120 so that the decoder 122 causes all of the gates of the selectors 140 to 147 to be closed and produces the "1" defective byte indication signal DEFCT. As a result, the AND circuit 168 is not opened so that the address counter 160 is not counted up. The AND circuit 170 is also not opened so that the data is not transferred to the external unit. The invalidity of the data at that timing is indicated to the external unit by an indication signal INDCT so that the external unit withhold the reception of data.

The eight-bit information of the minor loops #4 read at the next timing constitutes the third byte. Similarly, when the number of the defective loops in the minor loops which are read at the same timing exceeds a predetermined number (there in the illustrated embodiment) larger than the number of the spare chips, the data transfer from that minor loops is inhibited, and the data from the minor loops which can constitute the unit information (8 bits = 1 byte) are sequentially transferred. When a predetermined amount of data has been transferred to the external unit, the flip-flop 166 is reset by a signal FFRST and the transfer operation terminates. Then, the contents of the counter 160 and the register 162 are reset by a signal ADRST and a readout cycle is completed.

Since the timing of the data transfer from the AND circuit 150 to 157 to the external unit is skipped when a group of minor loops which include a predetermined number or more of the defective loops, the timing of data is not periodic. However, this will not pose a problem if the external unit adopts a response acknowledge type interface control system.

As described above, according to the present invention, the difference between the timings for the bits constituting one byte, which was encountered in the prior art systems, is eliminated and no shift register is necessary so that the hardware can be considerably saved. Furthermore, in the prior art system, if one defective minor loop is included in the group of minor loops which are read at the same timing, the entire minor loop cannot be used. On the other hand, according to the present system, when one byte (8 bits) is constituted by ten chips having five defect minor loops per chip, more than 99.86% of the chips can be used. It has been obtained from the equation $0^C132(127/132)^{132} + 1^C132(5/132)(127/132)^{131} + 2^C132(5/132)^2(127/132)^{131} + 3^C132(5/132)^3(127/132)^{129} + 4^C132(5/132)^4(127/132)^{128} + 5^C132(5/132)^5(127/132)^{128}$ (C: combination). Therefore, the advantage is beyond the cost of two additional spare chips, and the overall economy is materially improved.

In the above explanation, when the selector selects information of more number of bits (e.g. 10 bits) than the number of unit information (e.g. 8 bits=1 byte) which are read from the memory unit at the same timing, to produce the unit information, if the second bit is a defective bit, the third bit is used in place of the second bit and the subsequent bits are sequentially shifted by one bit position. It should be understood that the ninth bit read from the spare chip may be used for the second bit.

Furthermore, in the above explanation, the indication of the defective loops is coded as shown in FIG. 6 so that the decoder decodes the indication. Instead, the normal and defective conditions may be stored as "1" and "0" bits to indicate the defective positions.

The readout operation from one bubble memory unit has been explained in the above embodiment. The readout operation from a plurality of bubble memory units is now explained.

When the magnetic bubble memories are used as a file memory which requires a high transfer rate, the transfer operation to and from an upper order unit (external unit which is usually a data channel) normally occurs one at a time. Therefore, a common transfer unit and control unit may be used to the plurality of bubble memory units.

When the magnetic bubble memories are used as a file memory which requires a fast access speed, a multiplex operation between a plurality of bubble memory units is necessary. The following embodiment is useful to such an application.

Figure 7:
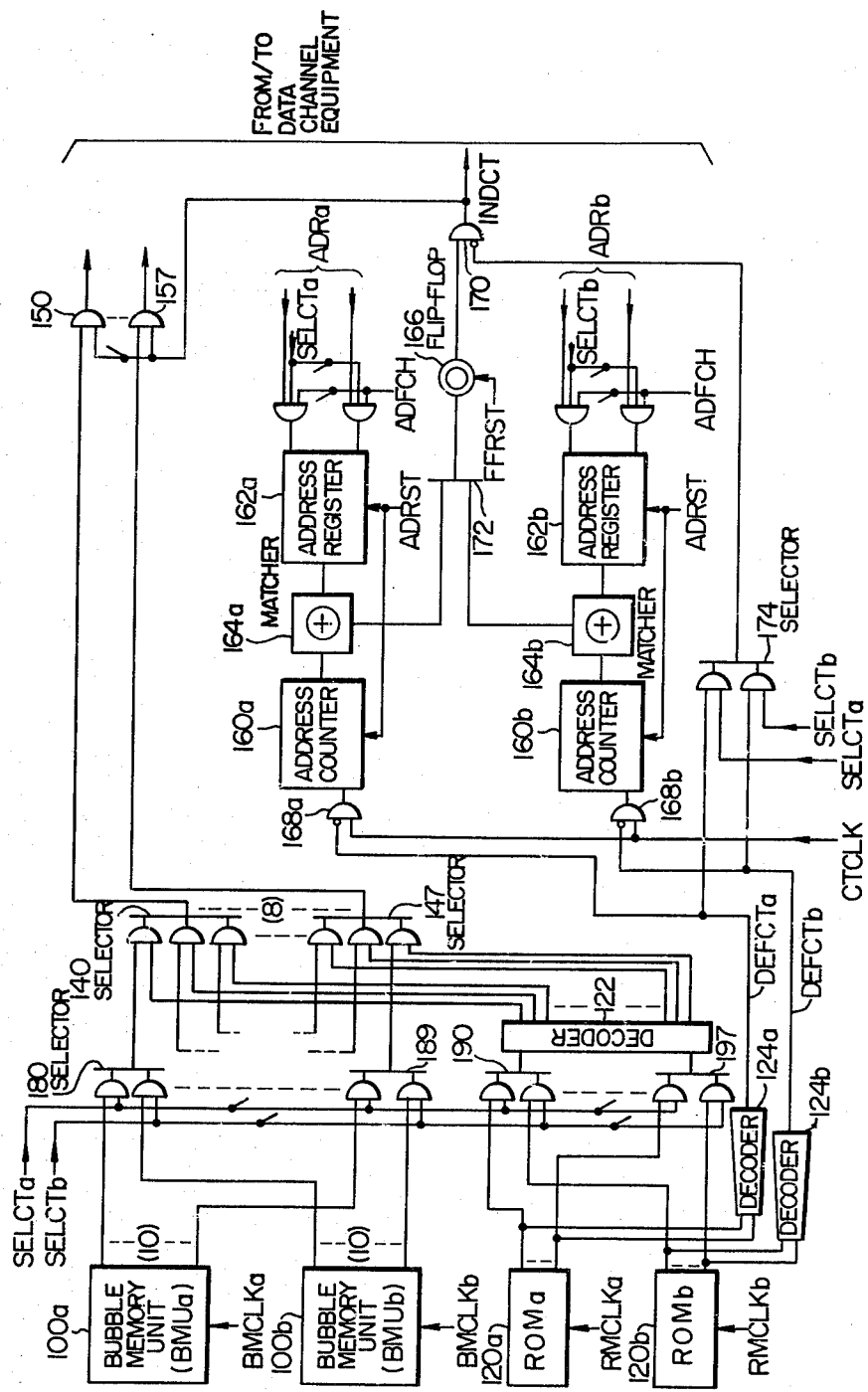
FIG. 7 shows a partial block diagram of one embodiment of the memory control system of the present invention which is used to carry out multiplex operation between two memory units.

FIG. 7 shows a configuration which carries out the multiplex operation between two magnetic bubble memory units. In FIG. 7, numerals 100a and 100b denote magnetic bubble memory units BMUa and BMUb, each of which includes ten magnetic bubble chips No. 0 to No. 9 like the unit 100 shown in FIG. 5, and each of which is operable independently from each other. Numerals 120a and 120b denote read-only memories ROMa and ROMb which correspond to the ROM 120 in FIG. 5 and store the normal and defective conditions of the information read from the memory units 100a (BMUa) and 100b (BMUb), respectively. The information read from the memory units 100a and 100b are selected by selectors 180 to 189 by selection signals SELCTa and SELCTb, respectively, and the information read from the ROM's 120a and 120b are also selected by selectors 190 to 197. The subsequent operation is similar to that for one memory unit, that is, the information read from the memory units 100a and 100b are selected by the selectors 140 to 147 in response to the output of the decoder 122 which decodes the information from the ROM's 120a and 120b, and sent to the AND circuits 150 to 157. Numerals 124a and 124b denote decoders which respond to the information from the ROM's 120a and 120b to produce defective byte indication signals DEFCTa and DEFCTb, respectively, indicating whether the information read from the memory units 100a and 100b, respectively, at the same timing can be used or not.

Address counters 160a and 160b, address registers 162a and 162b, matchers 164a and 164b and AND circuits 168a and 168b are provided for the memory units 100a and 100b, respectively, and the outputs of the matchers 164a and 164b are applied to the flip-flop 166 which is common to the units through the OR circuit 172. The output of the flip-flop 166 is applied to one input of the AND circuit 170, the other input of which receives the defective byte indication signals DEFCTa and DEFCTb through the selector 174.

Figure 8:
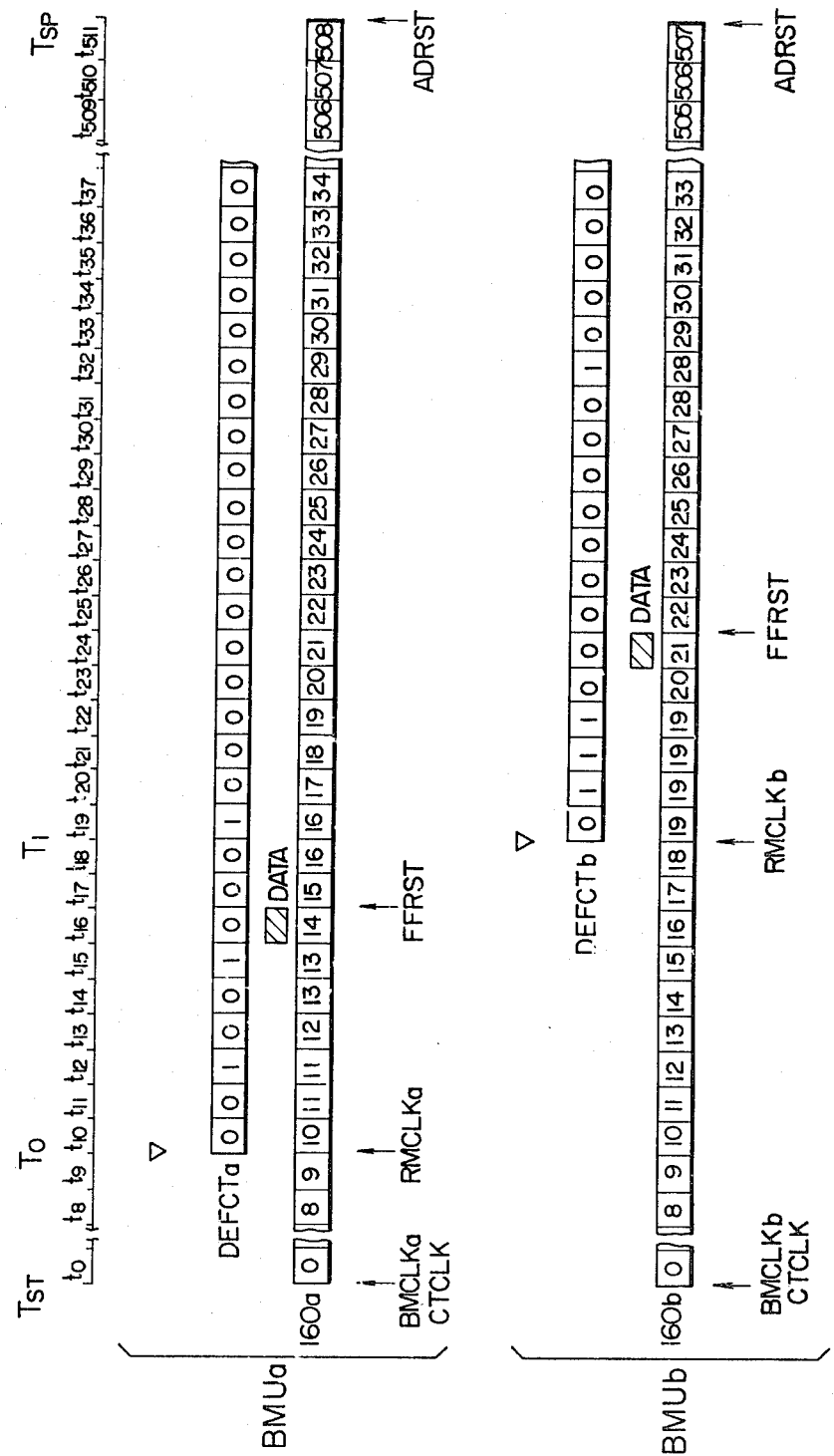
FIG. 8 shows a time chart illustrating data processing in the readout operation of the system shown in FIG. 7.

Referring to FIG. 8 which shows a time chart for FIG. 7, the operation of processing two access requests in one cycle time of the magnetic bubble memory is explained in detail. In FIG. 8, timing $T_{ST}$ indicates a start time of one cycle time, and timing $T_{SP}$ indicates an end time of the one cycle time. A rotating magnetic field is applied to the memory units 100a and 100b at the timing $T_{ST}$ by clock signals BMCLKa and BMCLKb, respectively so that the memory units start synchronous rotation. The application of the rotation magnetic field is stopped at the timing $T_{SP}$. The transfer-out operation of the memory unit 100a is to occur at a timing $T_0$ and the transfer-out operation of the memory unit 100b is to occur at a timing $T_1$. In order to simplify the explanation, it is assumed that the readout of data stored in the memory units 100a and 100b occurs directly after the time of the transfer-out so that the clock signals RMCLKa and RMCLKb are applied to the ROM 120a and the ROM 120b, respectively, at the timings $T_0$ and $T_1$, respectively to read out the data in the ROM's. It should, therefore, be noted that the read-out actually occurs with a physically predetermined step interval after the transfer-out operation. The data are read out at a fixed time interval t and the time slots within the time interval t are designated with $t_0, t_1, \ldots$ starting from $T_{ST}$. The ROM's 120a and 120b are also read out at the time interval t from the time of the transfer-out in the sequence of addresses 0, 1, . . . .

It is assumed here that in the memory unit 100a the second, fifth and ninth minor loop groups counted from the leading group include a predetermined number (three in the illustrated embodiment) or more of defective minor loops and hence cannot be used. Thus, the information indicative of defective byte are stored at addresses 2, 5 and 9 in the ROM 120a. Similarly, in the memory unit 100b, it is assumed that the first, second, third and thirteenth minor loop groups cannot be used and the information indicative of defective byte are stored at the addresses 1, 2, 3 and 13 in the ROM 120b. It is also assumed that the leading address information ADRa and ADRb to be accessed have been transferred from the external unit to the address registers 162a and 162b and the address 14 has been stored in the address register 162a and the address 21 has been stored in the address register 162b by an address fetch signal ADFCH and the selection signals SELCTa and SELCTb. The leading addresses represent the leading time slots to be accessed if no defective loop group is included.

Under these conditions, the rotating magnetic field is applied to the memory units 100a and 100b at the timing $T_{ST}$ and the information stored in the chips are moved along the minor loops. The address counters 160a and 160b start to be incremented by the clock signal CTCLK from the timing $T_{ST}$. At the timing $T_0$ (time slot $t_{10}$), the information stored in the chips of the memory units 100a is transferred out to the major loops and sequentially read by the detectors. At the same time, the readout of the ROM 120a is started. Since the first information read from the memory unit 100a at the same timing is normal one which can constitute the unit information (8 bits=1 byte), it is sent to the AND circuits 150 to 157 through the selectors 180 to 189 and 140 to 147 by the selection signal SELECTa and the decoder 122. On the other hand, since the decoder 124a produces the "0" defective byte indication signal DEFCT, the AND circuit 168a is opened so that the address counter 160a is incremented by the signal CTCLK. However, since there is no identity at this time between the content of the address counter 160a and the content of the address register 162a, the AND circuits 150 to 157 remain closed and the data are not transferred to the external unit. The read operation from the memory unit 100a at the next timing (time slot $t_{11}$) occurs in a similar manner.

At the timing of the time slot $t_{12}$, since the information read from the memory unit 100a cannot constitute the unit information, all of the gates of the selectors 140 to 147 are closed by the decoder 122. On the other hand, since the decoder 124a produces the "1" signal DEFCT, the AND circuit 168a is closed and the increment of the address counter 160a is stopped. The AND circuit 170 is also closed by the selector 174. Similarly, whenever the information read from the memory unit 100a cannot constitute the unit information, the increment of the address counter 160a is stopped and the transfer of the data to the external unit is inhibited. The content of the address counter 160a and the content (address 14) of the address register 162a coincide at the time slot $t_{16}$, when the flip-flop 166 is set by the output of the matcher 164a through the OR circuit 172. Since the information read from the memory unit 100a at this timing is normal, the 8-bit data based on that information are sent to the AND circuits 150 to 157 by the selectors 140 to 147. Since the signal DEFCTa is "0" indicating the normal byte, the AND circuit 170 is opened. Consequently, the AND circuits 150 to 157 are opened by the output of the flip-flop 166 and the 8-bit data are transferred to the external unit. Only one byte is transferred in the illustrated embodiment, in which case the flip-flop 168 is reset to terminate the transfer operation when the transfer of one byte has been completed.

Thereafter, at the timing $T_1$ (time slot $t_{19}$), the information stored in the memory unit 100b is transferred and starts to be read. At the same time, the readout from the ROM 120b also starts. On the other hand, at and after the time slot $t_{19}$, matching operation of the content of the address counter 160b and the content of the address register 162b takes place. When the information read from the memory unit 100b cannot constitute the unit information, the decoder 124b produces the "1" signal DEFCT so that the AND circuit 168b is closed to stop the increment of the address counter 160b. In this manner, at the timing of the time slot $t_{24}$, the identity of the content of the address counter 160b and the content (address 21) of the address register 162b is detected by the matcher 164b so that the flip-flop 166 is set again by the output of the matcher 164b through the OR circuit 172. Since the signal DEFCT b is "0" and the signal SELCTb is selected at this time, the information read from the memory unit 100b is converted to 8-bit data by the selectors 140 to 147 and the data is transferred to the external unit from the AND circuits 150 to 157 which are now opened. Again, since only one byte is transferred to the external unit, the flip-flop 166 is reset by the signal FFRST after the one byte data have been transferred.

On the other hand, in the memory units 100a and 100b, after the completion of the data transfer, data on the major loops are transferred in the minor loops and thus, one cycle of the operation is completed at the timing $T_{SP}$, at which the clock signal CTCLK is stopped and the contents of the address counters 160a and 160b and the address registers 162a and 162b are reset by the reset signal ADRST.

In the embodiment described above, the address counter is provided for each of the memory units. When a plurality of memory units are actually used, however, 8-unit multiplex or 16-unit multiplex is carried out depending on the requirement of enhancing processing capability. Consequently, the amount of hardware increases materially. An alternative embodiment is proposed, therefore, in which a common address counter is used to the plurality of memory units and the content of the address counter is incremented by the content of the ROM when defective byte is indicated. Even with such alternative, the increment circuit is required for each unit.

Figure 9:
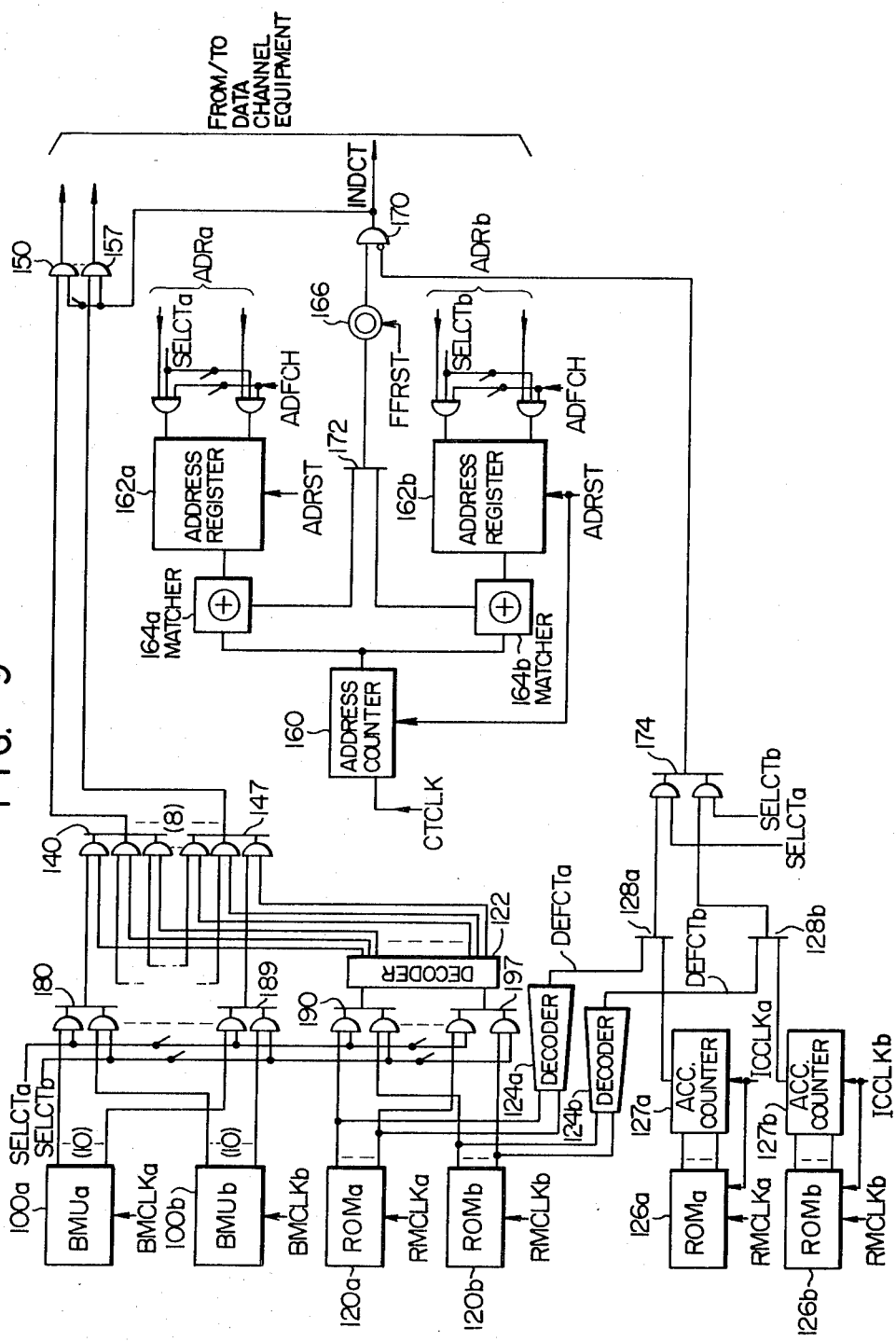
FIG. 9 shows a partial block diagram of another embodiment of the present invention which is used in carrying out the multiplex operation.

FIG. 9 shows a more preferred embodiment of the present invention which is an improvement over the previous embodiment and in which a single common address counter is used to a plurality of memory units. Essentially, other memories 126a and 126b are provided for storing timing delay from the normal timing caused by defective bytes, so that there is no need to read additional memories 120a and 120b until matching operation between a single common address counter 160 and each address register is achieved. That is, read-only memories (ROM's) 126a and 126b are provided for the memory units 100a and 100b, and at address N of each of which a difference between a position (Nm) of N-th normal minor loop group of the memory unit 100a or 100b and the number N is written so that information indicative of an accumulated number of the defective minor loop groups which cannot constitute the unit information is stored. For the memory unit 100a, the content of the ROM 126a is shown in the following table.

| Address (N) of ROM 126a | Position (Nm) of N-th normal loop group | Content (Nm-N) of ROM 126a |
| --- | --- | --- |
| 0 | 0 | 0 |
| 1 | 1 | 0 |
| 2 | 3 | 1 |
| 3 | 4 | 1 |
| 4 | 6 | 2 |
| 5 | 7 | 2 |
| 6 | 8 | 2 |
| 7 | 10 | 3 |
| 8 | 11 | 3 |

Numerals 127a and 127b denote accumulation counters which store information read from the ROM's 126a and 126b. They are counted down for each time slot after the contents of the ROM's 126a and 126b have been written and stop the count-down operation when the content of the counter reaches zero. The output of the accumulation counters 127a and 127b are "1" when the contents thereof are equal to or more than one, and "0" when the contents thereof are equal to zero. Numerals 128a and 128b denote OR circuits which perform logical OR function of the defective byte indication signals DEFCTa and DEFCTb, respectively, produced by the decoders 124a and 124b which decode the outputs of the ROM's 120a and 120b, and the outputs of the accumulation counters 127a and 127b, respectively. The single common address counter 160 is provided to the memory units 100a and 100b and the increment thereof is not stopped by the indication of defective byte. The remaining portions are identical to those of FIG. 7.

Figure 10:
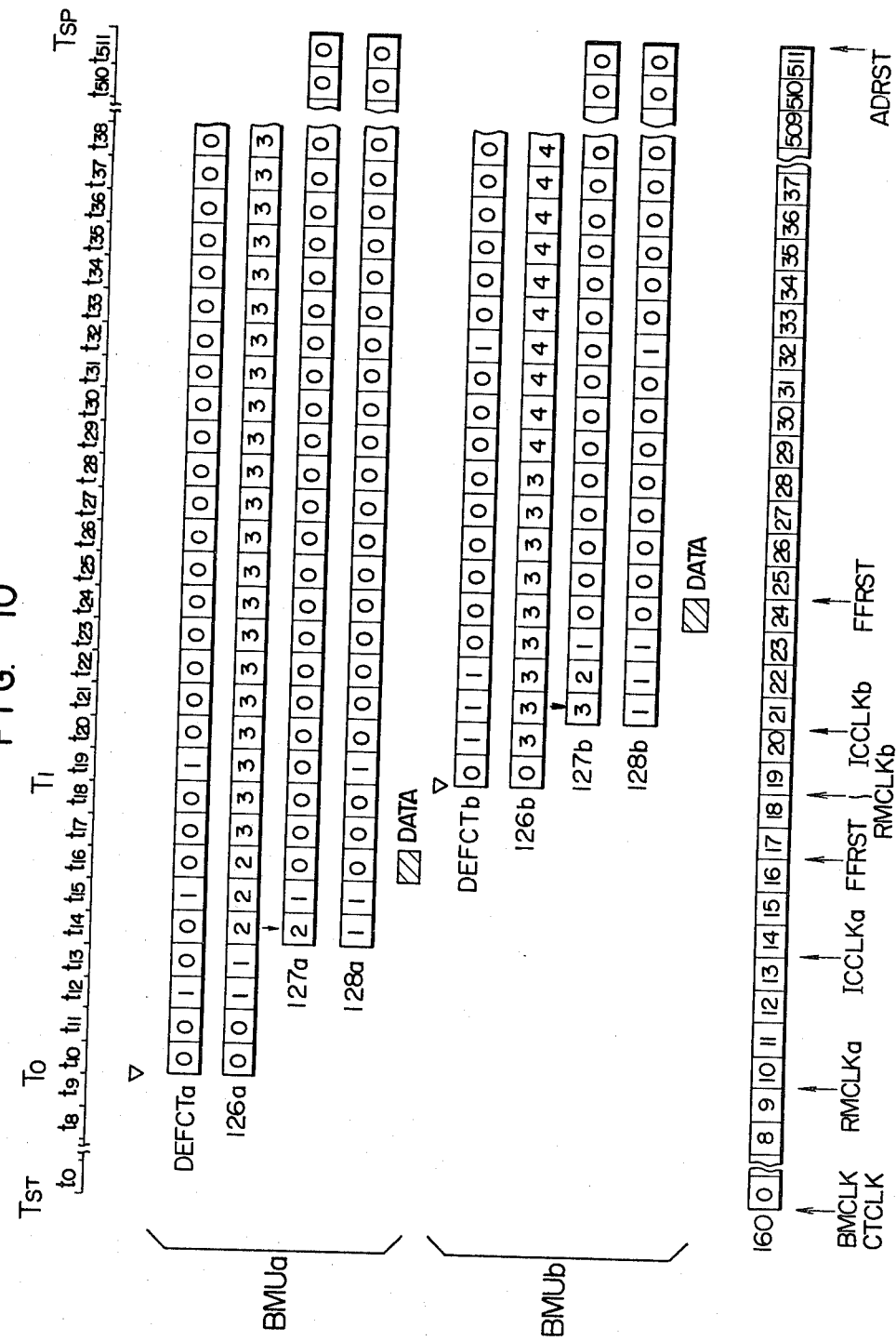
FIG. 10 shows a time chart illustrating the readout operation of the system shown in FIG. 9.

As in the previous embodiment, it is assumed that the address 14 has been stored in the address register 162a and the address 21 has been stored in the address register 162b, and matching operation with the address counter 160 takes place at each time slot. The operation is now explained with reference to FIG. 10.

At the timing $T_0$ (time slot $t_{10}$), the transferout operation of the memory unit 100a takes place and the readout of the information is started. The ROM's 120a and 126a are activated by the clock signal RMCLKa. However, the readout operations of the ROM's 120a and 126a do not occur at this time. At the time slot $t_{14}$, when the identity of the content of the address counter 160 and the content (address 14) of the address register 162a is detected by the matcher 164a, the flip-flop 166 is set. On the other hand, the contents of the ROM's 120a and 126a are read at this time and the number 2 is set to the accumulation counter 127a by the clock signal ICCLKa. The readout of the ROM 126a is stopped by the clock signal ICCLKa. As a result, the output of the counter 127a assumes "1" and the output of the OR circuit 128a also assumes "1". Since the select signal SELCTa is "1" at this time, the AND circuit 170 is closed by the selector 174. As a result, at the time slot $t_{14}$, the data transfer to the external unit does not take place although the flip-flop 166 is in set condition. At the next time slot $t_{15}$, the content of the accumulation counter 127a is counted down to one but the output remains "1" since the content of the counter 127a is one. Accordingly, the data transfer is again inhibited at the time slot $t_{15}$. At the time slot $t_{16}$, the content of the counter 127a is further counted down to zero so that the output thereof assumes "0". On the other hand, since the signal DEFCTa is also "0" at this time, the output of the OR circuit 128a is "0" so that the output of the flip-flop 166 is not inhibited by the AND gate 170 and applied to the AND circuits 150 to 157. As a result, the data are transferred from the time slot $t_{16}$. The subsequent operation is similar to that in the embodiment shown in FIGS. 7 and 8. The access to the memory unit 100b also takes place in a similar manner.

With this arrangement, the multiplex operation can be carried out with less amount of additional hardware. In the previous embodiment, the content of the ROM must be continuously read out after the transferout timing. In the present method, on the other hand, the content of the ROM need be read out after the matching of the addresses has occurred. Accordingly, the control is easier.

While the embodiments described above use an address counter for each memory unit, it should be understood that the address register may be implemented in an IC memory so that address information for the plurality of memory units are stored in one address register and the information stored therein is read in time-division fashion. In this case, the common address counter and matcher as well as the common address counter are used to the plurality of memory units and hence the amount of hardware is further decreased to further enhance the economy.

While the magnetic bubble memories have been shown and described, it should be understood that the present invention can be readily applied to the charge coupled device (CCD) memories or other shift register type memory which may be developed in the future.

What is claimed is:

1. A memory control system comprising:
   (a) a memory unit including a plurality of memory chips each having a plurality of information loops which may include one or more defective loops and transfer means for transferring information bits to or from selected ones of said information loops, the number of said memory chips being larger than the number of bits required for unit information;
   (b) an additional memory for storing information indicative of normal and defective conditions of said information loops in each of said chips;
   (c) control means for activating said transfer means in each of said chips and accessing to one information loop in each of said chips at the same timing to transfer the information bits to or from the information loop group; and
   (d) connection control means for reading information stored in said additional memory to determine locations of said defective information loops to identify the defective loops in the information loops of the respective chips accessed by said control means and selecting normal loops which are equal in number to the number of bits required for the unit information, for each information loop group accessed at each timing, when the number of the normal loops other than the defective loops included in said accessed information loop group is equal to or more than said number of bits required for the unit information, to connect the transfer means corresponding to those loops to an external unit.

2. A memory control system comprising:
   (a) a memory unit including a plurality of memory chips each having a shift register type memory having a plurality of information loops and means for reading bits from said information loops, the number of said memory chips being larger than a predetermined number of bits required for unit information;
   (b) means for controlling the readout of information bits stored in a group comprising corresponding information loops in the respective ones of said plurality of chips, by said read means at the same timing;
   (c) an additional memory for storing information indicative of locations of defective loops in said information loops in each of said chips;
   (d) bit selection means responsive to the information stored in said additional memory for selecting from the bits read from selected information loop groups at the same timing said predetermined number of bits of normal information loops other than the bits of said defective loops; and
   (e) transmission control means for controlling the transmission of said predetermined number of bits from said bit selection means to an external unit at an appropriate timing.

3. A memory control system according to claim 2 wherein said additional memory stores information indicative of whether each information loop group is faulty or normal for the bits read at the same timing, and further including means responsive to said information indicative of defective loop condition for inhibiting the selection by said bit selection means at corresponding timing and means responsive to said information indicative of defective loop condition for causing said transmission control means to withhold the transmission of the bits.

4. A memory control system according to claim 3 wherein said transmission control means includes a counter the counting operation of which is controlled by said withhold means, a register to which a leading address to be accessed is set, a matcher for detecting an identity between the content of said register and the content of said counter and gate means for transmitting the unit information in response to the output of said matcher and said withhold means.

5. A memory control system according to claim 2 further including:
   a second additional memory for storing an accumulated number of said defective loop groups in response to said information indicative of defective loop condition stored in said first additional memory; and
   means responsive to the information stored in said second additional memory and the information stored in said first additional memory to cause said transmission control means to withhold the transmission of the unit information bits by at least a number of timing cycles corresponding to said accumulated number.

6. A memory control system comprising:
   (a) a memory unit including a plurality of memory chips each having a shift register type memory having a plurality of information loops and means for writing bits into said information loops, the number of said memory chips being larger than a predetermined number of bits required for unit information;
   (b) means for controlling the write of information bits in a group comprising corresponding information loops in the respective ones of said plurality of chips, by said write means at the same timing;
   (c) an additional memory for storing information indicative of locations of defective loops in said information loops in each of said chips;
   (d) information loop selection means responsive to the information stored in said additional memory for selecting from an information loop group accessed by said control means at the same timing a number of normal loops other than the defective loops, the number of said normal loops corresponding to said predetermined number of bits; and
   (e) reception control means for controlling the reception of said predetermined number of bits from an external unit to said information loop selection means at an appropriate timing.

7. A memory control system according to claim 6 wherein said additional memory stores information indicative of defective loop condition or normal loop condition for each information loop group for the bits written at the same timing, and further including means responsive to said information indicative of the defective loop condition for inhibiting the selection by said information loop selection means at corresponding timing and means responsive to said information indicative of defective loop condition for causing said reception control means to withhold the reception of the bits.

8. A memory control system according to claim 7 wherein said reception control means includes a counter the counting operation of which is controlled by said withhold means, a register to which a leading address to be accessed is set, a matcher for detecting an identity between the content of said register and the content of said counter and gate means for receiving the unit information in response to the output of said matcher and said withhold means.

9. A memory control system according to claim 6 further including:
   a second additional memory for storing an accumulated number of said defective loop groups in response to said information indicative of defective loop condition stored in said first additional memory; and
   means responsive to the information stored in said second additional memory and the information stored in said first additional memory to cause said reception control means to withhold the reception of the unit information bits by at least a number of timing cycles corresponding to said accumulated number.

10. A memory control system comprising:
    (a) a plurality of memory units each having a plurality of chips, the number of said chips being larger than a predetermined number of bits required for unit information, each chip having a shift register type memory including a plurality of information loops, means for reading bits from said information loops and means for writing bits into said information loops;
    (b) a plurality of additional memories one for each of said plurality of memory units, each additional memory storing information indicative of locations of defective loops for each group of information loops in the plurality of chips of the corresponding memory unit for the bits read from or written into the corresponding memory unit at the same timing;
    (c) means for selecting one of said plurality of memory units and corresponding one of said plurality of additional memories;
    (d) bit selection means and information loop selection means connected to said plurality of memory units and said plurality of additional memories through said selction means;
       said bit selection means being responsive to the information stored in a selected one of said additional memories for selecting said predetermined number of bits other than the bits of the defective loops from those bits which are read from a selected one of said memory units at the same timing;
       said information loop selection means responsive to the information stored in a selected one of said additional memories for selecting said predetermined number of information loops other than the defective loops from the information loops for those bits which are written into a selected one of said memory units at the same timing; and
    (e) transmission control means for controlling the transmission of said predetermined number of unit information bits from said bit selection means to an external unit at an appropriate timing and reception control means for controlling the reception of said predetermined number of unit information bits from an external unit to said information loop selection means at an appropriate timing.

11. A memory control system according to claim 10 wherein each of said plurality of additional memories stores information indicative of defective loop condition or normal loop condition for each information loop group in the chips of the corresponding memory unit for those bits which are read from or written into the corresponding memory unit at the same timing;

said memory control system further including:
a plurality of second additional memories one for each of said plurality of first additional memories, each of said second additional memories being responsive to the information indicative of defective loop condition stored in the corresponding first additional memory to store information indicative of an accumulated number of the defective loop groups; and
means responsive to the information indicative of defective loop condition stored in said first additional memories and the information stored in the corresponding ones of said second additional memories to cause said transmission control means or said reception control means to withhold the transmission or reception of the unit information bits from or to the memory units corresponding to said first additional memories, by a time period determined depending on said accumulated number.

12. A memory control system according to claim 11 wherein said transmission control means or said reception control means is provided in common to said plurality of memory units such that it is used in a time-division fashion to each of said memory units.

13. A method for a memory control system, the memory control system comprising
a memory unit including a plurality of memory chips each having a plurality of information loops
the number of said memory chips being larger than the number of bits required for unit information,
each bit of each unit information being assigned for storage in an information loop of a configuration of loops within said number of chips,
each said information loop being located on a separate chip,
the improved method comprising:
identifying location of defective information loops within said configuration of loops, and
storing a bit assigned to said defective loop in a loop on a chip of said number of chips separate from the chip containing the defective loop.

14. The method of claim 13 wherein the storing step takes place simultaneously with storage of the remainder of the bits of the same unit information.

* * * * *